(12) United States Patent
Li et al.

(10) Patent No.: US 12,456,685 B2
(45) Date of Patent: Oct. 28, 2025

(54) MICROELECTRONIC DEVICES COMPRISING A BORON-CONTAINING MATERIAL, AND RELATED ELECTRONIC SYSTEMS AND METHODS

(71) Applicant: Micron Technology, Inc., Boise, ID (US)

(72) Inventors: Xiao Li, Boise, ID (US); Jordan D. Greenlee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 378 days.

(21) Appl. No.: 17/822,726

(22) Filed: Aug. 26, 2022

(65) Prior Publication Data
US 2023/0395507 A1    Dec. 7, 2023

Related U.S. Application Data

(60) Provisional application No. 63/365,646, filed on Jun. 1, 2022.

(51) Int. Cl.
| | |
|---|---|
| *H01L 23/532* | (2006.01) |
| *H01L 21/02* | (2006.01) |
| *H01L 23/528* | (2006.01) |

(52) U.S. Cl.
CPC ...... *H01L 23/5329* (2013.01); *H01L 21/0226* (2013.01); *H01L 23/528* (2013.01)

(58) Field of Classification Search
CPC ............. H01L 23/5329; H01L 21/0226; H01L 23/528; H01L 21/02129; H01L 21/02112; H01L 21/02271
See application file for complete search history.

(56) References Cited

U.S. PATENT DOCUMENTS

| | | | |
|---|---|---|---|
| 8,815,685 B2 * | 8/2014 | LiCausi | H01L 21/3105 438/269 |
| 9,142,676 B2 | 9/2015 | Ching et al. | |
| 9,397,046 B1 | 7/2016 | Sharangpani et al. | |
| 9,768,177 B2 | 9/2017 | Nobuto | |
| 2013/0320429 A1 | 12/2013 | Thomas | |
| 2018/0130707 A1 * | 5/2018 | Clendenning | H01L 21/76843 |

* cited by examiner

*Primary Examiner* — Patricia D Valenzuela
(74) *Attorney, Agent, or Firm* — TraskBritt

(57) ABSTRACT

A microelectronic device comprises a stack structure, a contact structure, a liner material, and a boron-containing material. The stack structure comprises alternating conductive structures and dielectric structures. The contact structure extends through the stack structure. The liner material is between the stack structure and the contact structure. The boron-containing material is between the liner material and the stack structure. Related electronic systems and methods are also described.

20 Claims, 9 Drawing Sheets

… (1)

MICROELECTRONIC DEVICES COMPRISING A BORON-CONTAINING MATERIAL, AND RELATED ELECTRONIC SYSTEMS AND METHODS

CROSS-REFERENCE TO RELATED APPLICATION

This application claims the benefit under 35 U.S.C. § 119(e) of U.S. Provisional Patent Application Ser. No. 63/365,646, filed Jun. 1, 2022, the disclosure of which is hereby incorporated herein in its entirety by this reference.

TECHNICAL FIELD

Embodiments of the disclosure relate to the field of electronic device design and fabrication. More specifically, embodiments of the disclosure relate to microelectronic devices including a boron-containing material, related electronic systems, and methods of fabricating such microelectronic devices and systems.

BACKGROUND

Microelectronic device designers often desire to increase the level of integration or density of features within a microelectronic device by reducing the dimensions of the individual features and by reducing the separation distance between neighboring features. In addition, microelectronic device designers often seek to design architectures that are not only compact, but offer performance advantages, as well as simplified designs. Reducing the dimensions and spacing of features has placed increasing demands on the methods used to form the microelectronic devices. One solution has been to form three-dimensional (3D) microelectronic devices, such as 3D NAND devices, in which memory cells are positioned vertically on a substrate. An example of a conventional vertical memory array includes strings of memory cells vertically extending through stack structures that include tiers of conductive structures and dielectric structures. Each string of memory cells may include at least one select device coupled thereto. Such a configuration permits a greater number of switching devices (e.g., transistors) to be located in a unit of die area (i.e., length and width of active surface occupied) by building the memory array upwards (e.g., longitudinally, vertically) on the substrate, as compared to structures with conventional planar (e.g., two-dimensional) arrangements of transistors. The increasing complexity of the microelectronic devices, such as 3D NAND devices, introduces challenges in forming such devices. For example, complex microelectronic devices may be prone to defects during and after formation.

DETAILED DESCRIPTION

Figure 1:
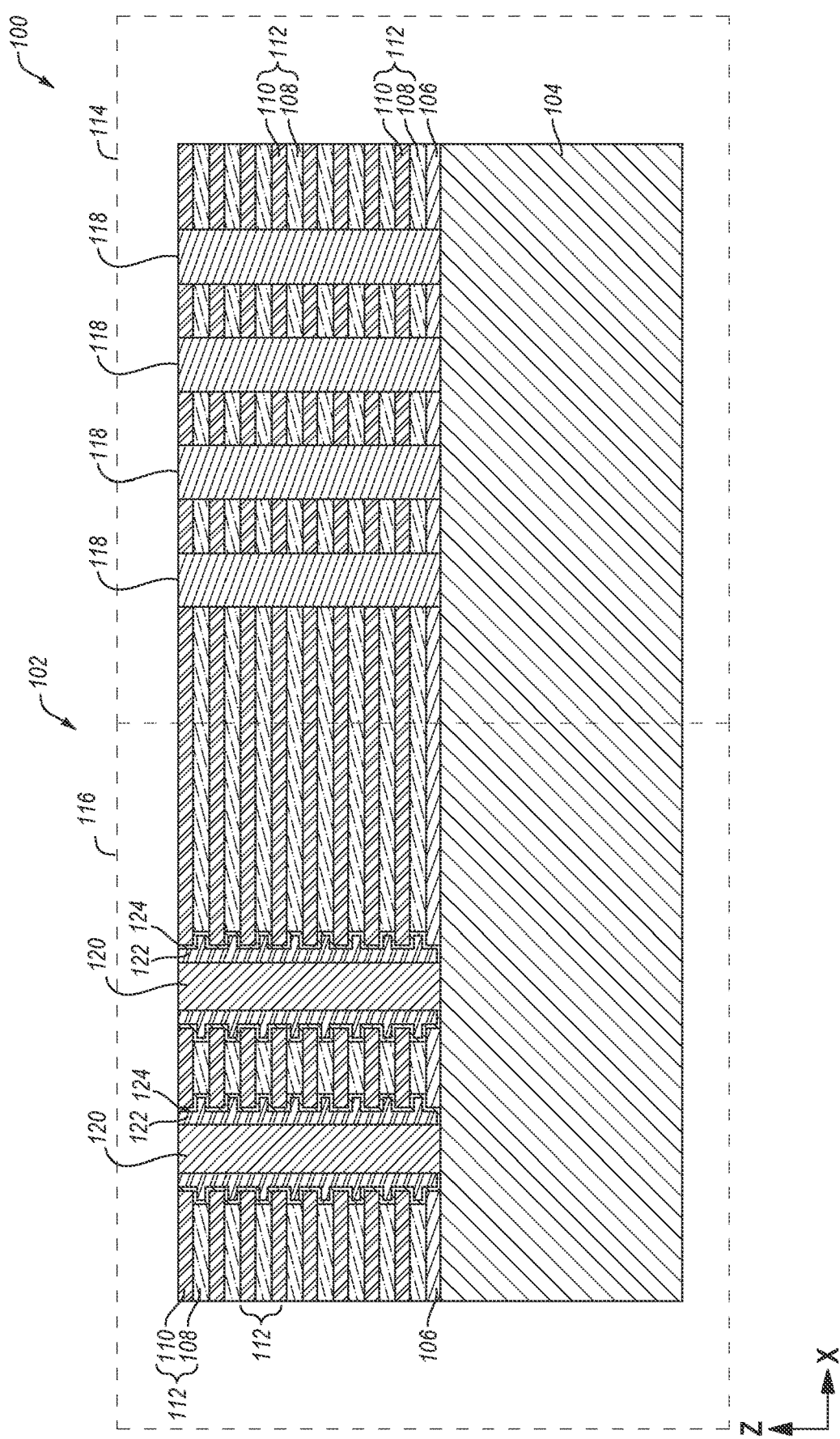
FIG. 1 is a simplified, partial cross-sectional view of a microelectronic device, in accordance with embodiments of the disclosure.

The following description provides specific details, such as material types, material thicknesses, and processing conditions in order to provide a thorough description of embodiments of the disclosure. However, a person of ordinary skill in the art will understand that the embodiments of the disclosure may be practiced without employing these specific details. Indeed, the embodiments of the disclosure may be practiced in conjunction with conventional fabrication techniques employed in the industry. In addition, the description provided below does not form a complete process flow for manufacturing a microelectronic device or electronic system. The structures described below do not form a complete microelectronic device or electronic system. Only those process acts and structures necessary to understand the embodiments of the disclosure are described in detail below. Additional acts to form a complete microelectronic device or electronic system from the structures may be performed by conventional fabrication techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, the term "microelectronic device" includes a device exhibiting memory functionality, but is not limited to microelectronic devices exhibiting memory functionality. Stated another way, and by way of example only, the term "microelectronic device" includes conventional memory (e.g., conventional volatile memory, such as conventional dynamic random access memory (DRAM); conventional non-volatile memory, such as conventional NAND memory), and an application specific integrated circuit (ASIC) (e.g., a system on a chip (SoC)), a microelectronic device combining logic and memory, and a graphics processing unit (GPU) incorporating memory.

As used herein, the term "configured" refers to a size, shape, material composition, material distribution, orientation, and arrangement of one or more of at least one structure and at least one apparatus facilitating operation of one or more of the structure and the apparatus in a predetermined way.

As used herein, the phrase "coupled to" refers to structures operatively connected with each other, such as electrically connected through a direct Ohmic connection or through an indirect connection (e.g., by way of another structure).

As used herein, the singular forms "a," "an," and "the" are intended to include the plural forms as well, unless the context clearly indicates otherwise.

As used herein, "and/or" includes any and all combinations of one or more of the associated listed items.

As used herein, the terms "vertical," "longitudinal," "horizontal," and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure. With reference to the figures, a "horizontal" or "lateral" direction may be perpendicular to an indicated "Z" axis, and may be parallel to an indicated "X" axis and/or parallel to an indicated "Y" axis; and a "vertical" or "longitudinal" direction may be parallel to an indicated "Z" axis, may be perpendicular to an indicated "X" axis, and may be perpendicular to an indicated "Y" axis.

As used herein, reference to a feature as being "over" an additional feature means and includes the feature being directly on top of, adjacent to (e.g., horizontally adjacent to, vertically adjacent to), underneath, or in direct contact with the additional feature. It also includes the element being indirectly on top of, adjacent to (e.g., horizontally adjacent to, vertically adjacent to), underneath, or near the additional feature, with one or more other features located therebetween. In contrast, when an element is referred to as being "on" or another element, there are no intervening features therebetween.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, features (e.g., regions, materials, structures, devices) described as "neighboring" one another means and includes features of the disclosed identity (or identities) that are located most proximate (e.g., closest to) one another. Additional features (e.g., additional regions, additional materials, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

Unless the context indicates otherwise, the materials described herein may be formed by any suitable process including, but not limited to, spin coating, blanket coating, chemical vapor deposition ("CVD"), atomic layer deposition ("ALD"), plasma enhanced ALD, physical vapor deposition ("PVD") (including sputtering, evaporation, ionized PVD, and/or plasma-enhanced CVD (PECVD)), or epitaxial growth. Alternatively, the materials may be grown in situ. Depending on the specific material to be formed, the technique for depositing or growing the material may be selected by a person of ordinary skill in the art. In addition, unless the context indicates otherwise, the removal of materials described herein may be accomplished by any suitable process including, but not limited to, etching (e.g., dry etching, wet etching, vapor etching), ion milling, abrasive planarization (e.g., chemical-mechanical planarization ("CMP")), and/or other known methods.

As used herein, "dielectric material" means and includes electrically insulative material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, a dielectric material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, a "dielectric structure" means and includes a structure formed of and including one or more dielectric materials.

As used herein, "conductive material" means and includes electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Jr), nickel (Ni), palladium (Pd), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively doped semiconductor material (e.g., conductively-doped polysilicon, conductively-doped germanium (Ge), conductively-doped silicon germanium (SiGe)). In addition, a "conductive structure" means and includes a structure formed of and including conductive material.

Microelectronic devices, and electronic systems described herein include a boron-containing material. A precursor of the boron-containing material may react with residues produced during formation of the microelectronic device, producing the boron-containing material on exposed surfaces (e.g., side surfaces) of the microelectronic device. By way of example only, the precursor may react with residues (e.g., chemical compounds) remaining within a stack structure of the microelectronic device following a removal process that recesses conductive structures of the stack structure. Reaction products of the precursor and the residues may include the boron-containing material and gaseous products. The presence of the boron-containing material in the microelectronic device may help to prevent diffusion of a halogen (e.g., fluorine, chlorine, bromine, iodine, or a combination thereof) species from the conductive structures of the stack structure to a liner material interposed between the boron-containing material and a contact structure. By preventing the diffusion of halogen species, the formation of reactive halide compounds is reduced (e.g., prevented). The boron-containing material may, therefore, reduce (e.g., prevent) the formation of voids within the liner material, and may improve the performance and/or longevity of microelectronic devices, and electronic systems including the boron-containing material.

FIG. 1 is a simplified, partial cross-sectional view illustrating a microelectronic device 100, in accordance with embodiments of the disclosure. The microelectronic device 100 may, for example, be a 3D NAND Flash memory device, such as a multi-deck 3D NAND Flash memory device.

Referring now to FIG. 1, the microelectronic device 100 includes a stack structure 102 vertically neighboring (e.g., vertically adjacent to) a source 104. For example, the source 104 may be vertically underlying (e.g., in the Z-direction) the stack structure 102. The stack structure 102 may include a base material 106 vertically overlying (e.g., in the Z-direction) the source 104, and a vertically alternating (e.g., in the Z-direction) sequence of conductive structures 108 (e.g., access lines, word lines) and dielectric structures 110 arranged in tiers 112 on the base material 106.

As illustrated in FIG. 1, the microelectronic device 100 includes an array region 114 and a contact region 116 adjacent to (e.g., in the X-direction) the array region 114. Within the array region 114, the stack structure 102 includes one or more memory cells 118 (e.g., vertical strings of memory cells) extending through the stack structure 102 to the source 104. While FIG. 1 illustrates the memory cells 118 as a single material, multiple materials may be present including, but not limited to, a channel material, a tunnel dielectric material, a memory material, and a charge blocking material. The array region 114 of the microelectronic device 100, and the memory cells 118 of the array region 114 may be formed by conventional techniques. Additionally, the memory cells 118 may comprise any suitable materials. The memory cells 118 may be defined at intersections between the materials of the memory cells 118 and the conductive structures 108.

Adjacent to the array region 114 is the contact region 116. Within the contact region 116, the microelectronic device 100 includes contact structures 120, a liner material 122 between the stack structure 102 and the contact structures 120, and a boron-containing material 124 between the stack structure 102 and the liner material 122. For example, one of the contact structures 120 may include the liner material 122 interposed between the stack structure 102 and the contact structure 120, and the boron-containing material 124 may be interposed between the stack structure 102 and the liner material 122.

The stack structure 102 may be formed in a conventional manner and may comprise conventional materials. For example, the base material 106, the conductive structure 108, and/or the dielectric structures 110 may be formed in a conventional manner and may comprise conventional materials.

The base material 106 may be formed of and include at least one dielectric material. The base material 106 of the stack structure 102 may be substantially planar, and may exhibit a desired thickness.

The conductive structures 108 may comprise one or more conductive materials. In some embodiments, the conductive structures 108 comprise tungsten. The conductive structures 108 of each of the tiers 112 of the stack structure 102 may each be substantially planar, and may each individually exhibit a desired thickness.

Figure 2:
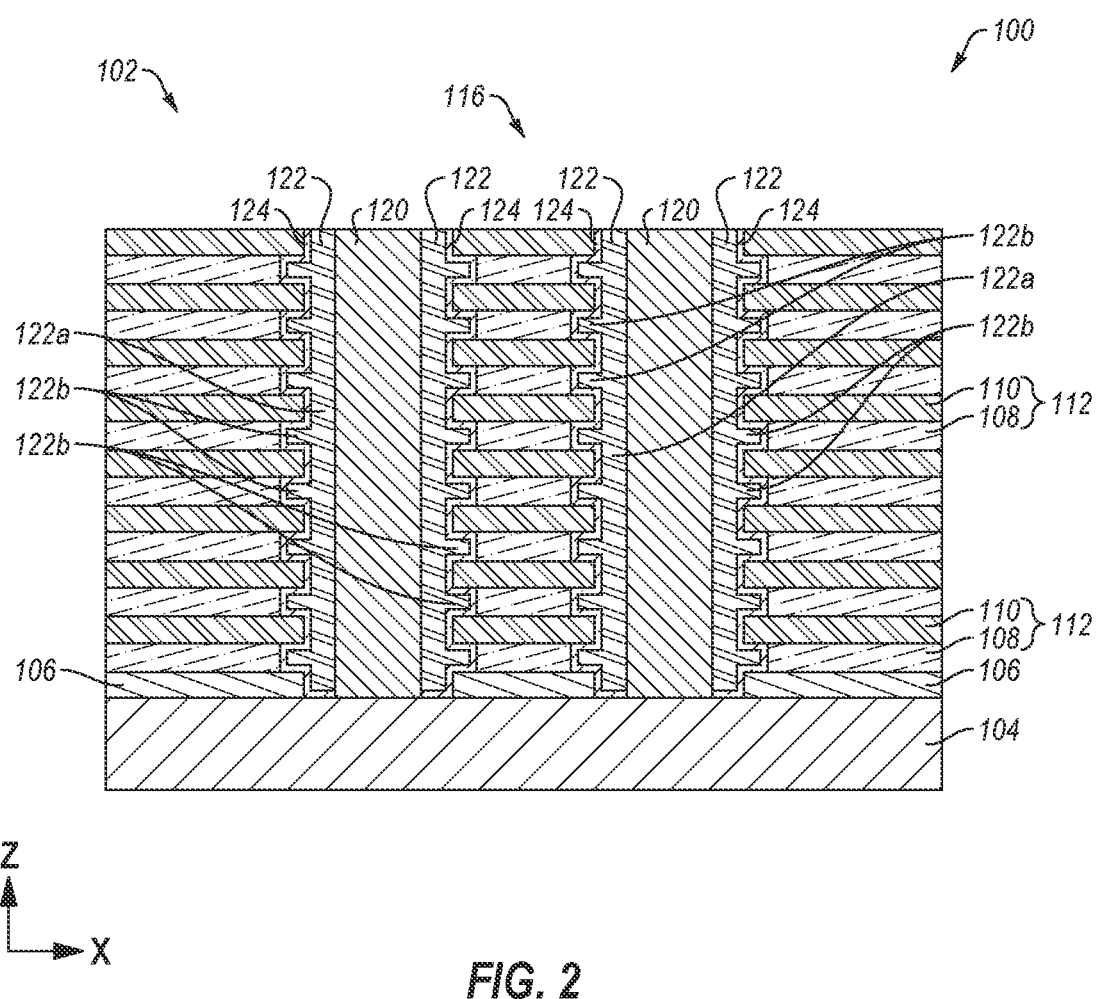
FIG. 2 is an enlarged view of a portion of the microelectronic device of FIG. 1, in accordance with embodiments of the disclosure.

While not illustrated in FIGS. 1 and 2 for simplicity, the conductive structures 108 may include a liner material (not shown) and a barrier material (not shown) around the conductive structures 108, such as between the conductive structures 108 and the dielectric structures 110. The liner material may comprise, for example, a seed material from which or upon which the conductive structures 108 may be formed. The liner material may be formed of and include, for example, a metal (e.g., titanium, tantalum), a metal nitride (e.g., tungsten nitride, titanium nitride, tantalum nitride), or another material. The barrier material may, for example, be aluminum oxide. In some embodiments, the conductive liner material comprises titanium nitride and the barrier material comprises aluminum oxide.

A conductive structure 108 of the stack structure 102 near (e.g., vertically adjacent to) the base material 106 may function as at least one lower select gate (e.g., at least one source side select gate (SGS)) of the microelectronic device 100. In some embodiments, a single (e.g., only one) conductive structure 108 of a vertically lowermost tier 112 of the stack structure 102 functions as a lower select gate (e.g., a SGS) of the microelectronic device 100. In addition, upper conductive structure(s) 108 of the stack structure 102 may function as upper select gate(s) (e.g., drain side select gate(s) (SGDs)) of the microelectronic device 100. In some embodiments, horizontally neighboring (e.g., in the X-direction or Y-direction) conductive structures 108 of a vertically uppermost tier 112 of the stack structure 102 function as upper select gates (e.g., SGDs) of the microelectronic device 100.

The dielectric structures 110 may comprise one or more dielectric materials. In some embodiments, the dielectric structures 110 comprise silicon dioxide.

Although FIGS. 1 and 2 illustrate a particular number of tiers 112 of the dielectric structures 110 and the conductive structures 108, the disclosure is not so limited. In some embodiments, the stack structure 102 includes a desired quantity of the tiers 112, such as greater than sixty-four (64) of the tiers 112 (e.g., greater than or equal to seventy (70) of the tiers 112, greater than or equal to one hundred (100) of the tiers 112, greater than or equal to about one hundred twenty-eight (128) of the tiers 112) of the dielectric structures 110 and the conductive structures 108. In addition, in some embodiments, the stack structure 102 overlies and/or underlies a deck structure (not shown) comprising additional tiers 112 of dielectric structures 110 and conductive structures 108, separated from the stack structure 102 by at least one dielectric material, such as an interdeck dielectric material (not shown).

The microelectronic device 100 further includes the source 104 vertically adjacent to the stack structure 102. For example, the source 104 may vertically underlie (e.g., in the Z-direction) the stack structure 102. The source 104 may comprise, for example, one or more conductive materials. In some embodiments, the source 104 comprises conductively-doped polysilicon.

FIG. 2 illustrates an enlarged view of the contact region 116 of the microelectronic device 100, in accordance with embodiments of the disclosure. To avoid repetition, not all features shown in FIG. 2 are described in detail herein.

Although FIGS. 1 and 2 illustrate two contact structures 120, the microelectronic device 100 includes two or more (e.g., multiple) contact structures 120. The contact structures 120 may be within (e.g., partially within, substantially within, entirely within) the stack structure 102.

Referring now to FIG. 2, the liner material 122 may be interposed between the stack structure 102 and the contact structure 120. For example, the liner material 122 may substantially surround (e.g., substantially contact) surfaces (e.g., side surfaces) of the contact structure 120. Additionally, the boron-containing material 124 may be interposed between the liner material 122 and the stack structure 102. For example, the boron-containing material 124 may substantially surround (e.g., substantially contact horizontally and vertically oriented) portions of the stack structure 102 and/or the liner material 122.

The contact structure 120 may exhibit a desired geometric configuration (e.g., dimensions and shape). The geometric configuration of the contact structure 120 may be selected at least partially based on the configurations and positions of other components (e.g., the memory cells 118) of the microelectronic device 100 and positions of other contact structures 120.

The contact structure 120 may be spaced relative to other components of the microelectronic device 100, which may permit the contact structure 120 to vertically-extend (e.g., in the Z-direction) through the stack structure 102 and physically contact (e.g., land on) the source 104 to facilitate a predetermined function (e.g., an electrical interconnection function, a support function) of the contact structure 120. In some embodiments, the contact structure 120 functions as an electrical interconnection. In additional embodiments, the contact structure 120 does not provide an electrical interconnection and primarily (e.g., only) provides a support function. Each of the contact structures 120 may exhibit substantially the same geometric configuration (e.g., the same dimensions and the same shape) and horizontal spacing (e.g., in the X-direction) as each of the other contact structures 120, or at least some of the contact structures 120 may exhibit a different geometric configuration (e.g., one or more different dimensions, a different shape) and/or different horizontal spacing than at least some other of the contact structures 120. In some embodiments, the contact structures 120 are uniformly spaced in a direction (e.g., in the X-direction and/or in the Y-direction). In additional embodiments, the contact structures 120 are arranged in rows extending in the X-direction and in columns extending in the Y-direction. In further embodiments, the contact structures 120 are non-uniformly spaced in a direction (e.g., in the X-direction and/or the Y-direction).

The contact structures 120 may exhibit a substantially cylindrical shape and/or an annular shape. For example, one of the contact structures 120 may comprise an annular conductive structure that may include a dielectric material and/or additional conductive material within the interior cavity of the annular conductive structure. Additionally, one of the contact structures 120 may comprise a solid cylindrical conductive structure. In some embodiments, the microelectronic device 100 includes contact structures 120 and some of contact structures 120 exhibit cylindrical shapes and others of the contact structures 120 exhibit annular shapes.

In some embodiments, the contact structure 120 may be formed of and include at least one conductive material. In some embodiments, the contact structure 120 comprises a metal material, such as tungsten (W).

The contact structure 120 may include a single, substantially homogeneous composition of at least one conductive material, or a substantially heterogeneous composition of the at least one conductive material. In some embodiments, the contact structure 120 includes a single material having a homogeneous composition of the conductive material. In additional embodiments, the contact structure 120 includes multiple materials, each having a homogeneous composition, or a single material having a heterogeneous composition of the at least one conductive material. The contact structure 120 may, for example, be formed of and include at least two different conductive materials.

The contact structure 120 may function as a support structure during and/or after the formation of one or more components of the microelectronic device 100 (FIGS. 1 and 2). For example, the contact structure 120 may function as the support structure for the formation of the conductive structures 108 during replacement of the sacrificial structures 338 with the conductive structures 108, as described below in relation to FIGS. 3A-3E with reference to the so-called "replacement gate" or "gate last" process acts. The contact structure 120 may impede (e.g., prevent) tier collapse during the selective removal of the sacrificial structures.

In embodiments in which the function of the contact structure 120 is primarily a support structure, the contact structure 120 may be formed of and includes a dielectric material. For example, the contact structure 120 may be formed of and include at least one dielectric material. In some embodiments, the contact structure 120 comprises a dielectric material.

The microelectronic device 100 also includes the liner material 122 interposed between the stack structure 102 and the contact structure 120. For example, the liner material 122 may be horizontally (e.g., in the X-direction) interposed between the contact structure(s) 120 and the tiers 112 (including the conductive structures 108 and dielectric structures 110 thereof) of the stack structure 102. Additionally, the liner material 122 may substantially surround (e.g., substantially contact) surfaces (e.g., side surfaces) of the contact structure 120. In some embodiments, the liner material 122 contacts the boron-containing material 124 and the contact structure 120.

The liner material 122 may exhibit substantially non-uniform dimensions (e.g., thicknesses) in the X-direction and/or the Y-direction. For example, the liner material 122 may comprise a portion 122a that continuously extends vertically along an entire length of the contact structure(s) 120 and additional portions 122b protruding from the portion 122a. The portion 122a of the liner material 122 may exhibit substantially uniform dimensions (e.g., thicknesses) in the X-direction and/or the Y-direction while the additional portions 122b horizontally neighboring (e.g., horizontally adjacent to) the conductive structures 108 of the stack structure 102 extend perpendicular relative to the portion 122a. Accordingly, the liner material 122 may exhibit a greater dimension (e.g., greater thickness) in the X-direction and/or the Y-direction at the additional portions 122b (e.g., protrusions) of the liner material 122 neighboring the conductive structures 108 than the portion 122a of the liner material 122 neighboring the dielectric structures 110. In other words, the conductive structures 108 of the stack structure 102 proximate the contact structure 120 are horizontally recessed relative to the dielectric structures 110, and the horizontal recesses are substantially filled with the materials of the liner material 122 and/or the boron-containing material 124. As non-limiting examples, the portion 122a of the liner material 122 may exhibit a thickness of from about 1 nm to about 150 nm, such as from about 10 nm to about 100 nm or from about 25 nm to about 60 nm (e.g., about 40 nm). Similarly, the additional portions 122b of the liner material 122 may exhibit a thickness of from about 1 nm to about 150 nm, such as from about 10 nm to about 100 nm or from about 25 nm to about 60 nm (e.g., about 40 nm).

The liner material 122 may include a substantially homogeneous composition or a substantially heterogeneous composition. In some embodiments, the liner material 122 exhibits a substantially homogeneous distribution of the conductive material. In additional embodiments, the liner material 122 exhibits a substantially heterogeneous distribution of at least one dielectric material. The liner material 122 may, for example, be formed of and include at least two different materials.

The liner material 122 may be formed of and include at least one dielectric material. The liner material 122 may, for example, be selectively removable (e.g., selectively etchable) responsive to exposure to etch chemistries formulated and configured to remove the sacrificial structures 338. In some embodiments, the liner material 122 may be formed of and include one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), at least one dielectric carboxynitride material (e.g., $SiO_xC_zN_y$), and amorphous carbon. For example, the liner material 122 may include a highly uniform and highly conformal silicon oxide material (e.g., a highly uniform and highly conformal silicon dioxide material). In some embodiments, the liner material 122 comprises a high quality conformal oxide, such as a highly conformal silicon oxide (e.g., $SiO_2$). In some embodiments, the liner material 122 has a different material composition than the base material 106. In other embodiments, the liner material 122 has the same material composition as the base material 106. In some embodiments, the liner material 122 comprises a material composition that is not substantially removed (e.g., is selectively etchable) responsive to exposure to etch chemistries formulated and configured to remove silicon nitride.

The microelectronic device 100 also includes the boron-containing material 124 interposed between the stack structure 102 and the contact structure 120. For example, the boron-containing material 124 may be horizontally (e.g., in the X-direction) interposed between the liner material 122 and the tiers 112 (including the conductive structures 108 and dielectric structures 110 thereof) of the stack structure 102. In some embodiments, the boron-containing material 124 is on (e.g., directly contacts) side surfaces of the stack structure 102. For example, the boron-containing material 124 may be on vertical surfaces and/or horizontal surfaces of the dielectric structures 110 and on vertical surfaces of the conductive structures 108 of the stack structure proximate to the contact structure 120. In additional embodiments, the boron-containing material 124 is on (e.g., directly contacts) the liner material 122. The boron-containing material 124 may separate the liner material 122 from the tiers 112 of the stack structure 102. In some embodiments, the boron-containing material 124 also separates the liner material 122 from the source 104.

In some embodiments, the boron-containing material 124 exhibits substantially uniform dimensions (e.g., thickness) in the X-direction, the Y-direction, and/or the Z-direction. For example, the boron-containing material 124 may exhibit a thickness of from about 1 nm to about 150 nm, such as from about 10 nm to about 100 nm or from about 25 nm to about 60 nm (e.g., about 40 nm). In some embodiments, the boron-containing material 124 exhibits a thickness of from about 1 nm to about 50 nm. Additionally, the boron-containing material 124 may conform to the geometry of the stack structure 102 and/or the liner material 122.

The boron-containing material 124 may be substantially homogeneous in chemical composition or substantially heterogeneous in chemical composition.

The boron-containing material 124 may be a chemical compound that includes boron and one or more other chemical element. The boron-containing material 124 may be a boron oxide material (BA), a silicon boride material ($Si_xB_y$), a silicon boron oxide material ($Si_xB_yO_z$), or a combination thereof. The boron-containing material 124 may be a stoichiometric compound or a non-stoichiometric compound, and values of "x" and "y" may be integers or may be non-integers. The boron-containing material 124 may include boron hydride in addition to the boron oxide material, the silicon boride material, or the silicon boron oxide material. As non-limiting examples, the boron oxide material may include, but is not limited to, boron trioxide ($B_2O_3$), boron suboxide ($B_6O$), or a combination thereof. As non-limiting examples, the silicon boride material may include, but is not limited to, hexaboron silicide ($B_6Si$), silicon hexaboride ($SiB_6$), silicon tetrabromide ($SiB_4$), silicon triboride ($SiB_3$), or a combination thereof. The silicon boron oxide material may include silicon boride and silicon oxide. In additional embodiments, the boron-containing material 124 includes boron hydride ($B_xH_y$) in addition to the boron oxide material, the silicon boride material, and/or the silicon boron oxide material. As a non-limiting example, the boron-containing material 124 may include diborane ($B_2H_6$). In some embodiments, the boron-containing material 124 comprises boron trioxide ($B_2O_3$). In further embodiments, the boron-containing material 124 comprises boron suboxide ($B_6O$). The boron-containing material 124 may be formed by reaction of a precursor (e.g., precursor 334 below in FIG. 3C) of the boron-containing material 124 with residues produced during formation of the microelectronic device 100. Additional process acts may be conducted to convert a portion or all of the boron-containing material 124 to boron oxide.

The precursor of the boron-containing material 124 may react with and/or remove residues remaining from process acts conducted during formation of the microelectronic device 100. The boron-containing material 124 may be further converted to boron oxide by subsequent process acts. The resulting boron-containing material 124 may substantially prevent or reduce diffusion of halide compounds (e.g., compounds of fluorine, chlorine, bromine, iodine) from the conductive structures 108 to the liner material 122. Thus, the boron-containing material 124 may substantially prevent or reduce the formation of voids within the liner material 122, and may improve the performance and/or longevity of the microelectronic device 100. The performance and/or longevity of microelectronic devices (e.g., the microelectronic device 100 (FIG. 1), the microelectronic device 400 of FIG. 4 below), and/or electronic systems (e.g., electronic system 500 of FIG. 5 below) including the including boron-containing material 124 may also be improved.

Thus, in accordance with embodiments of the disclosure, a microelectronic device comprises a stack structure, a contact structure, a liner material, and a boron-containing material. The stack structure comprises alternating conductive structures and dielectric structures. The contact structure extends through the stack structure. The liner material is between the stack structure and the contact structure. The boron-containing material is between the liner material and the stack structure.

FIGS. 3A-3E are simplified, partial cross-sectional views illustrating a microelectronic device 300 at different processing stages of a method of forming the microelectronic device 100 in accordance with embodiments of the disclosure. In FIGS. 3A-3E and the associated description, functionally similar features (e.g., structures, materials) to those of the microelectronic device 100 of FIGS. 1 and 2 are referred to with similar reference numerals incremented by 200. To avoid repetition, not all features shown in FIGS. 3A-3E are described in detail herein. Rather, unless described otherwise below, a feature as shown in FIGS. 3A-3E designated by a reference numeral that is a 200 increment of the reference numeral of a previously described feature will be understood to be substantially similar to the previously described feature.

For simplicity, FIGS. 3A-3E show only a contact region 316 of the microelectronic device 300. However, it is understood that an array region similar to the array region 114 of FIG. 1 is present horizontally adjacent to the contact region 316. The array region includes memory cells that may be formed before or after forming the contact structures 320 of FIG. 3E (e.g., the contact structures 120 of FIG. 1).

Referring collectively to FIGS. 3A-3E, the microelectronic device 300 comprises a stack structure 302 (e.g., a preliminary stack structure). The microelectronic device 300 may also include a source 304 vertically underlying (e.g., in the Z-direction) the stack structure 302. The stack structure 302 includes a base material 306 vertically overlying (e.g., in the Z-direction) the source 304, and a vertically alternating (e.g., in the Z-direction) sequence of sacrificial structures 338 and dielectric structures 310 arranged in tiers 312 on the base material 306. Each of the tiers 312 of the stack structure 302 comprises one of the sacrificial structures 338 and one of the vertically neighboring dielectric structures 310. The stack structure 302 may be formed by conventional techniques.

The sacrificial structures 338 may include dielectric structures similar to the dielectric structures 310, but the sacrificial structures 338 may be selectively removable (e.g., selectively etchable) relative to the dielectric structures 310. For example, the sacrificial structures 338 may comprise a dielectric nitride material if the dielectric structures 310 comprise a dielectric oxide material. The sacrificial structures 338 are subsequently removed and replaced with the conductive material of the conductive structures 108.

Figure 3A:
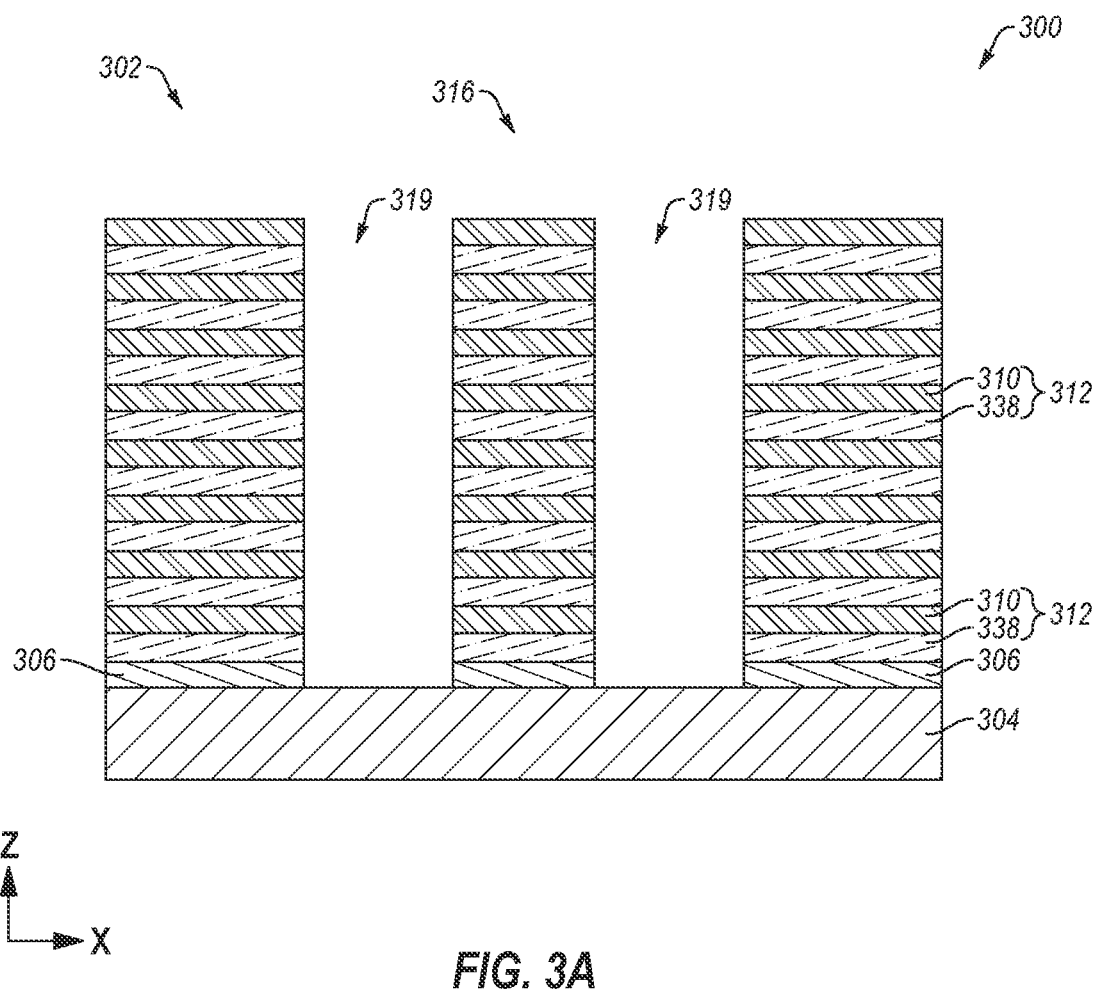
FIGS. 3A through 3E are simplified, partial cross-sectional views illustrating the microelectronic device of FIGS. 1 and 2 at different processing stages of a method of forming the microelectronic device, in accordance with embodiments of the disclosure.

Referring now to FIG. 3A, openings 319 may be formed within the stack structure 302 at a location corresponding to the ultimate location of the contact structures (e.g., the contact structures 120 of FIGS. 1 and 2) to be formed therein. The openings 319 may extend at least partially into the stack structure 302. For example, the openings 319 may vertically (e.g., in the Z-direction) extend through all of the tiers 312 and/or the base material 306, and the openings 319 may terminate at the source 304, as shown. The openings 319 may be formed by one or more etch processes. After forming the openings 319, side surfaces of the sacrificial structures 338 and the dielectric structures 310 are substantially coplanar.

Figure 3B:
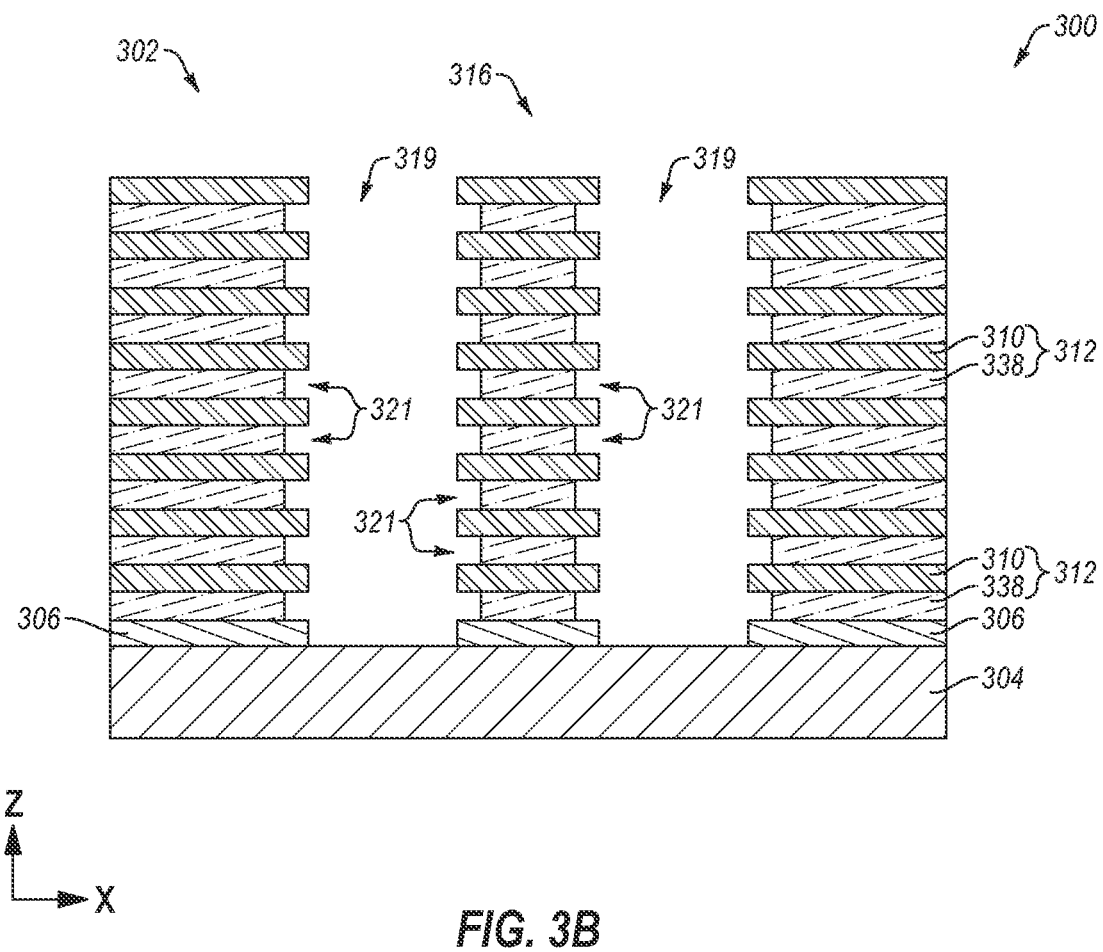

Referring now to FIG. 3B, a portion of the sacrificial structures 338 may be selectively removed (e.g., selectively etched) to form recesses 321 extending horizontally (e.g., in the X-direction) within the sacrificial structures 338. Since the sacrificial structures 338 and the dielectric structures 310 may include different materials, the sacrificial structures 338 are etched at a faster rate and/or to a greater extent than the dielectric structures 310 when exposed to the same etch conditions. Accordingly, the sacrificial structures 338 may be horizontally recessed relative to vertically neighboring (e.g., vertically adjacent) dielectric structures 310. The lowermost sacrificial structure 338 may be horizontally recessed relative to the base material 306 and the vertically adjacent dielectric structure 310. If, for example, the sacrificial structures 338 are formed from a nitride material, such as silicon nitride, the recesses 321 may be formed by exposing the microelectronic device 300 to a so-called "wet nitride strip" etch process. The recesses 321 produced by the removal of the sacrificial structures 338 result in side surfaces of the sacrificial structures 338 being offset relative to side surfaces of the dielectric structures 310.

Figure 3C:
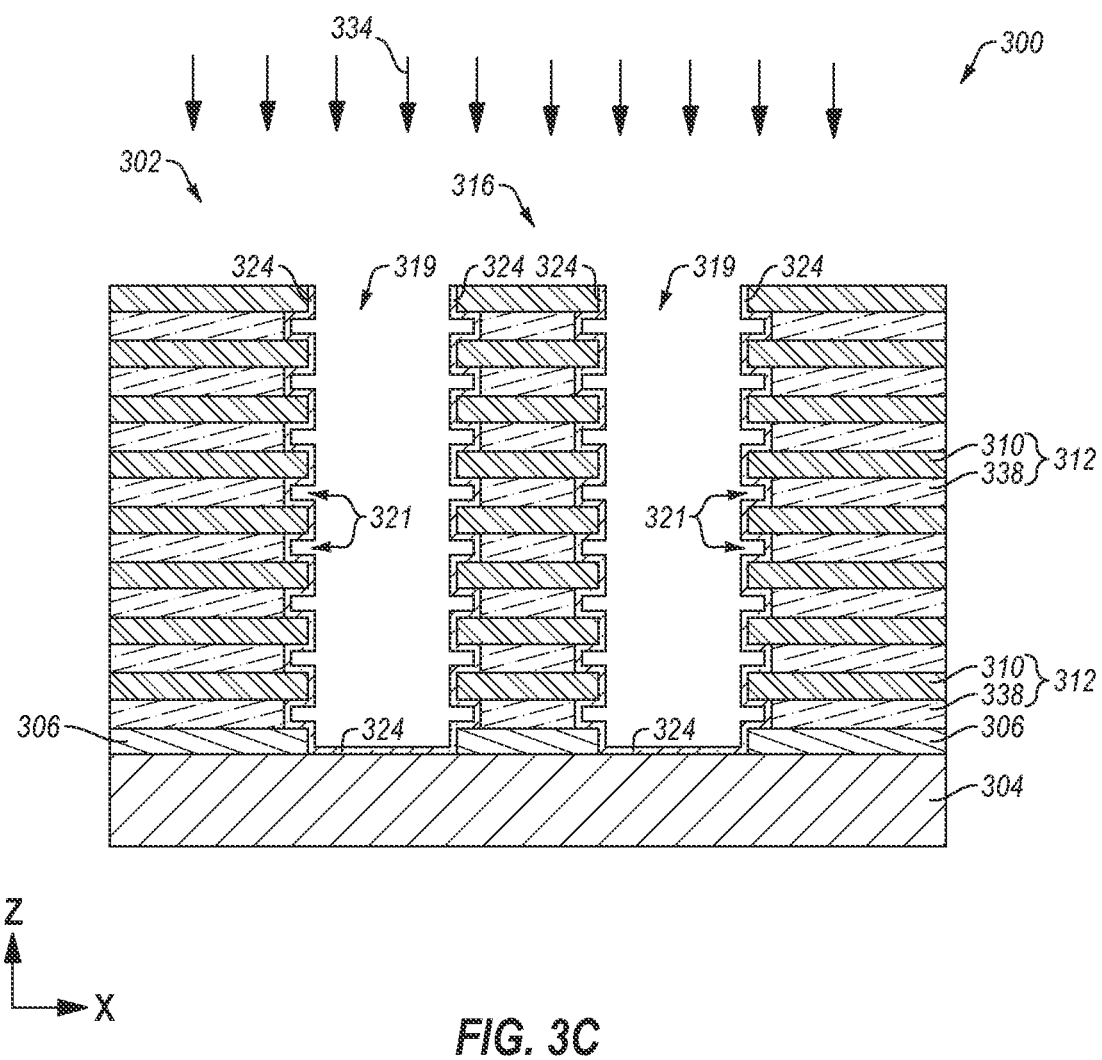

During the formation of the recesses 321, residues (not shown) produced by the etch conditions (e.g., etch chemistry, process conditions) may be formed and remain on exposed surfaces of the sacrificial structures 338 and/or the dielectric structures 310 within the openings 319 of the stack structure 302. The residues may include, but are not limited to, various chemical species that are reactive with a precursor 334 of a boron-containing material 324, as shown in FIG. 3C. One or more of the residues may react with the precursor 334 of the boron-containing material 324, forming the boron-containing material 324.

Referring now to FIG. 3C, the boron-containing material 324 may be formed (e.g., deposited) on the exposed surfaces (e.g., side surfaces) of the stack structure 302 within the openings 319. The boron-containing material 324 may partially fill the recesses 321. To form the boron-containing material 324, surfaces (e.g., side surfaces) of the stack structure 302 within the openings 319 are exposed to the precursor 334 of the boron-containing material 324. The precursor 334 of the boron-containing material 324 may be a boron-containing gas (e.g., diborane ($B_2H_6$) or boric acid ($H_3BO_3$)) that is reactive with at least some of the residues present in the recesses 321. For example, the boron-containing material 324 may be conformally formed on vertical side surfaces and/or exposed horizontal surfaces of the dielectric structures 310, vertical side surfaces of the sacrificial structures 338, vertical side surfaces and/or horizontal surfaces of the base material 306, and/or on an upper horizontal surface of the source 304. Accordingly, the boron-containing material 324 is conformally formed on exposed surfaces of the stack structure 302, the base material 306, and the source 304. In some embodiments the boron-containing material 324 comprises a dielectric material and the boron-containing material 324 at least partially (e.g., partially, substantially, completely) fills the recesses 321.

The boron-containing material 324 may be formed by positioning the microelectronic device 300 of FIG. 3B within a chamber that is pressurized at from about 10 Torr to about 100 Torr, and maintained at a temperature of from about 20° C. to about 600° C. The temperature within the chamber may range from about 20° C. to about 400° C., from about 100° C. to about 400° C., from about 100° C. to about 500° C., from about 100° C. to about 600° C., from about 100° C. to about 600° C., from about 300° C. to about 600° C., or from about 500° C. to about 600° C. The precursor 334 of the boron-containing material 324 may be introduced into the chamber at a rate of from about 1 standard cubic centimeters per minute (SCCM) to about 10,000 SCCM. The precursor 334 reacts with the residues, forming the boron-containing material 324 and volatile species, which are removed from the chamber. The thickness of the boron-containing material 324 may depend on the process conditions used to form the boron-containing material 324. By adjusting the duration of time to which the microelectronic device 300 is exposed to the precursor 334 and/or the temperature within the chamber, the boron-containing material 324 may be formed at a desired thickness. For instance, the thickness of the boron-containing material 324 may be increased by increasing the exposure time and/or temperature within the chamber.

The precursor 334 of the boron-containing material 324 reacts with the residues to conformally form the resulting boron-containing material 324. The boron-containing material 324 may include elemental boron, polymeric boron, and/or a boron-containing compound, such as boron oxide. The boron-containing material 324 may include a substantially homogeneous chemical composition throughout its thickness or a substantially heterogeneous chemical composition throughout its thickness. In some embodiments, the boron-containing material 324 exhibits a substantially homogeneous composition of elemental boron, of polymeric boron, or of the boron-containing compound. In additional embodiments, the boron-containing material 324 exhibits a heterogeneous chemical composition, such as including portions of elemental boron, polymeric boron, and/or the boron-containing compound. For example, in some embodiments, the boron-containing material 324 comprises a bi-layer of elemental boron and boron oxide. The elemental boron may, for example, be present proximal to the stack structure 302 and the boron oxide may be present distal to the stack structure 302. The boron oxide of the boron-containing material 324 may, for example, be proximal to the opening 319.

Alternatively, the boron-containing material 324 may include elemental boron as initially formed and at least a portion of the elemental boron may be converted to boron oxide as a result of subsequent processing acts, such as the subsequent formation of other materials of the microelectronic device 300. The initially formed, boron-containing material 324 may be converted to boron oxide by the process conditions used in the formation of the liner material 322 (see FIG. 3D). Some or all of the elemental boron may, for example, be converted to boron oxide after forming a silicon oxide material as the liner material 322. The relative thickness of the elemental boron and the boron oxide may depend on the process conditions used to form the other materials of the microelectronic device 300.

Figure 3D:
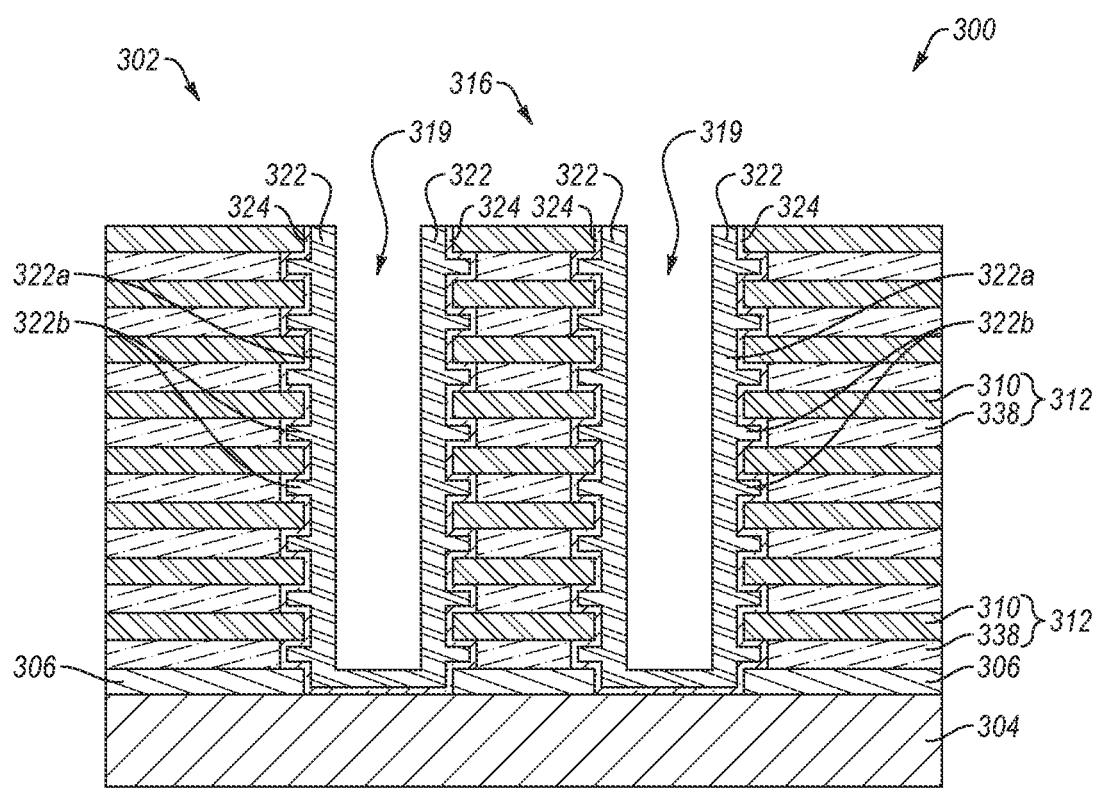

Referring now to FIG. 3D, a liner material 322 (e.g., the liner material 122 of FIGS. 1 and 2) may be formed (e.g., disposed, deposited) on the boron-containing material 324 within the openings 319. The liner material 322 may partially fill the openings 319 and may substantially completely fill the recesses 321.

Since the liner material 322 is formed in the recesses 321 and adjacent to the dielectric structures 310, the liner material 322 exhibits non-uniform dimensions (e.g., thicknesses) in the X-direction, or in the Y-direction. For example, and similar to that described above in FIG. 2, the liner material 322 may include a portion 322a that continuously extends vertically along an entire length of the stack structure 302 within the openings 319, and additional portions 322b protruding horizontally from the portion 322a. Additionally, the liner material 322 may be formed on the boron-containing material 324 overlying the source 304.

The liner material 322 may be formed of and include a dielectric material. In some embodiments, the liner material 322 may be formed of and include one or more of a dielectric oxide material. In some embodiments, the liner material 322 comprises a high quality, conformal oxide, such as a high quality, conformal silicon oxide (e.g., $SiO_2$). In some embodiments, the material composition of the liner material 322 is not substantially removed responsive to exposure to etch chemistries formulated and configured to remove the sacrificial structures 338.

The process conditions used to form the liner material 322 may convert at least a portion of the initially formed boron-containing material 324 to boron oxide.

Figure 3E:
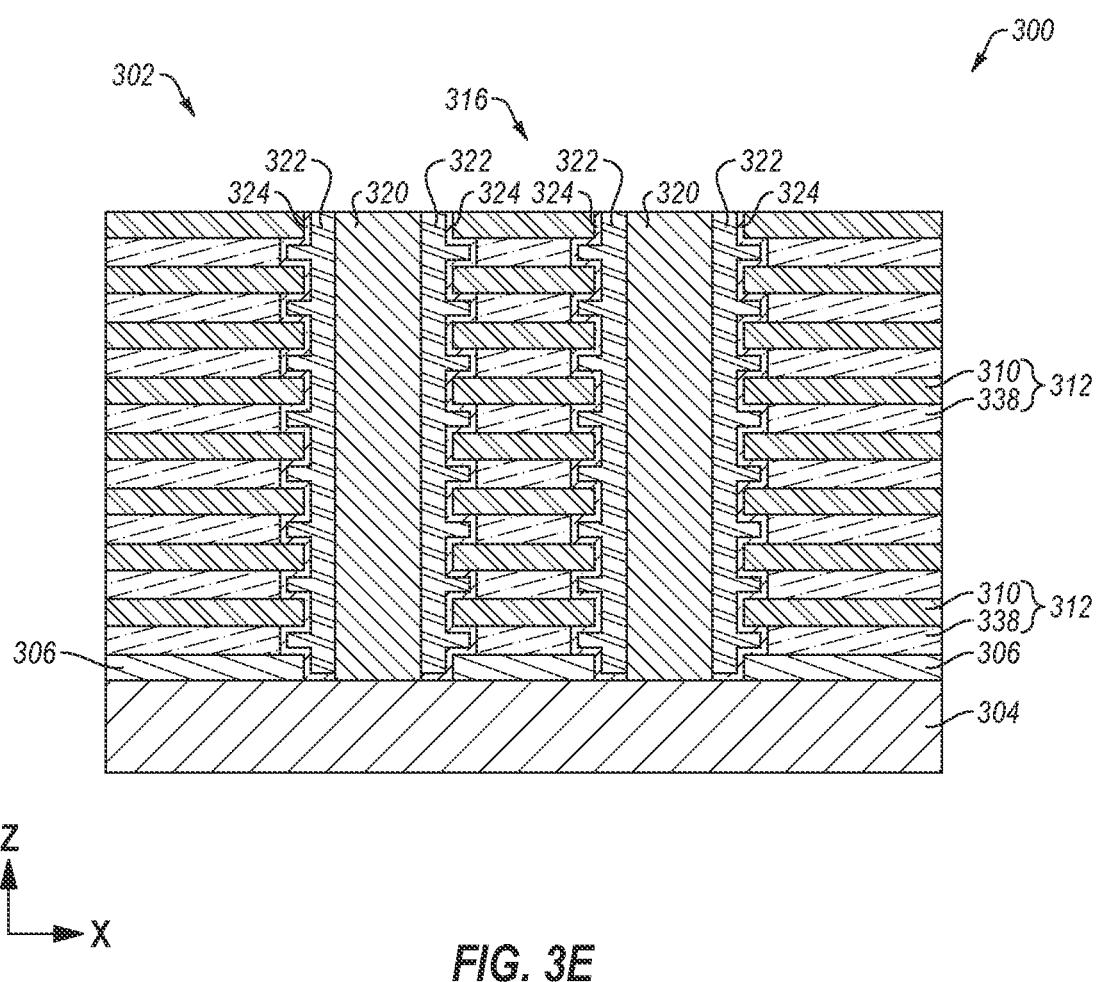

Referring now to FIG. 3E, portions of the liner material 322 and/or the boron-containing material 324 overlying the source 304 may be removed such that the openings 319 (FIG. 3D) extend to the source 304. The liner material 322 may be separated from the source 304 by the boron-containing material 324. Contact structures 320 may be formed within the openings 319 and the contact structures 320 may extend through the stack structure 302 and terminate at the source 304. For example, the contact structure 320 may contact the source 304.

Slots (not shown) may be formed through the stack structure 302 at desired locations of the microelectronic device 300, such as horizontally adjacent to the contact structures 120 in the contact region 116. The slots may be formed by conventional techniques. The sacrificial structures 338 may be selectively removed (e.g., exhumed) through the slots and replaced with the conductive material of the conductive structures 108 by a "so-called" replacement gate process. The contact structures 320 may provide support to the dielectric structures 310 during the replacement gate process. Spaces formed between vertically neighboring dielectric structures 310 by the removal of the material of the sacrificial structures 338 may be filled with the conductive material to form a stack structure (e.g., the stack structure 102 of FIG. 1), including the tiers 112 of conductive structures 108 and dielectric structures 110. The conductive structures 108 may be located at locations corresponding to the previous locations of the sacrificial structures 338 removed through the slots.

During removal of the sacrificial structures 338 and formation of the conductive structures 108, halide compounds, such as hydrogen fluoride, may be produced. If the halide compound was to diffuse through a conventional microelectronic device, voids are formed in the liner material. However, with the microelectronic device 100 containing the boron-containing material 124, the diffusion of halide compounds is substantially reduced or eliminated, reducing the formation of voids in the liner material 322. Without being bound by any theory, it is believed that the boron-containing material 124 functions as a barrier to the halide compounds. The presence of the boron-containing material 124 and corresponding reduction in voids reduces shorts and leakage electrical fails between the conductive structures 108 (e.g., word lines). In addition, breakdown voltage between the conductive structures 108 and the contact structures 320 is improved. By removing the volatile species produced during the formation of the boron-containing material 124, contaminants in the liner material 122 may also be reduced.

Thus, in accordance with embodiments of the disclosure, a microelectronic device comprises a stack structure, a boron-containing material, and a dielectric material. The stack structure comprises a contact structure and tiers of alternating conductive structures and dielectric structures. The boron-containing material is on vertical surfaces of the tiers. The dielectric material is between the boron-containing material and the contact structure.

Thus, in accordance with embodiments of the disclosure, a method of forming a microelectronic device comprises forming an opening within a stack structure comprising vertically alternating sacrificial structures and dielectric structures. The method additionally comprises forming a boron-containing material on exposed surfaces of the stack structure within the opening. The method further comprises forming a contact structure within the opening.

Figure 4:
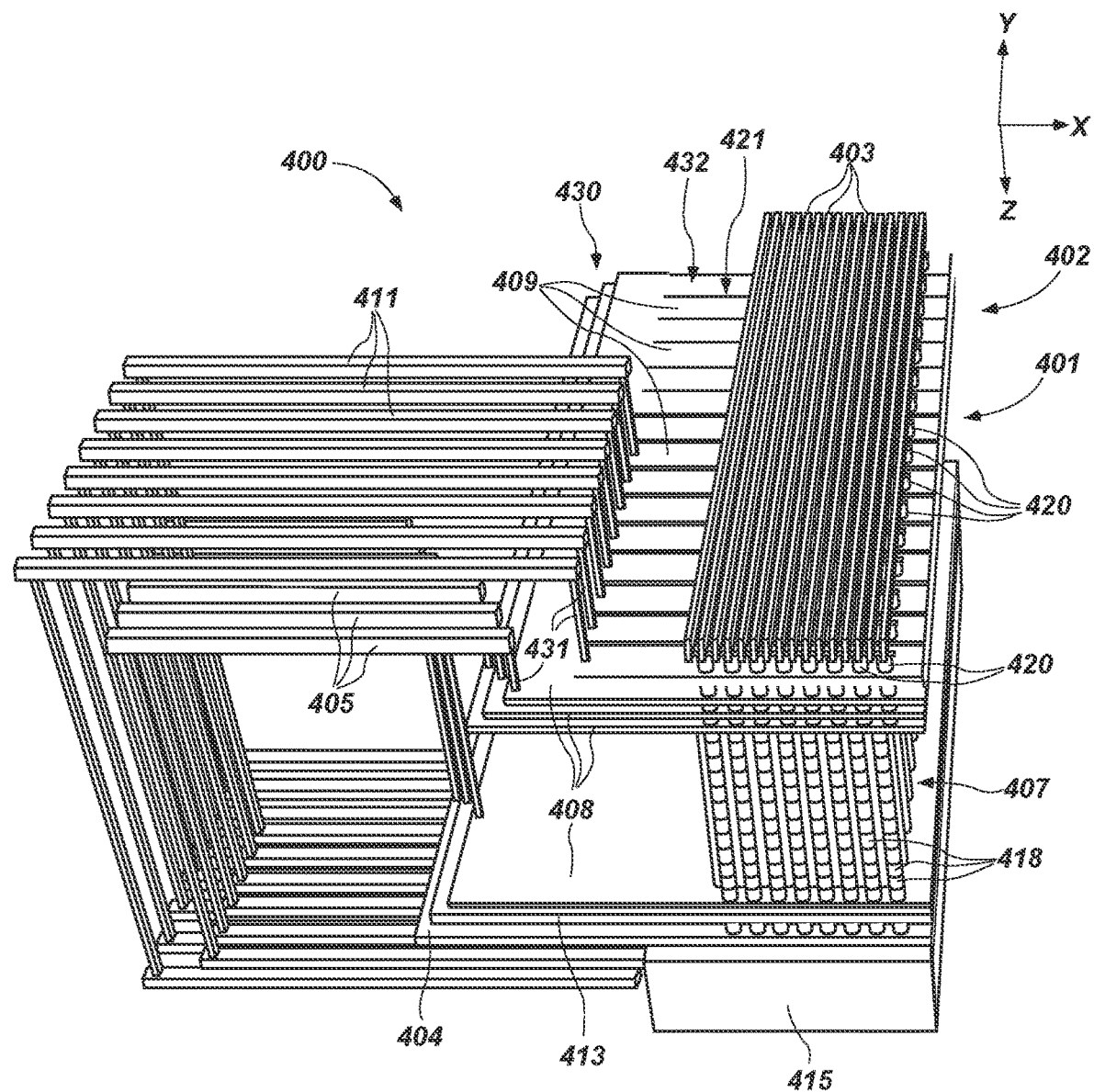
FIG. 4 is a partial cutaway perspective view of a microelectronic device, in accordance with embodiments of the disclosure.

FIG. 4 illustrates a partial cutaway perspective view of a microelectronic device 400. The microelectronic device 400 may include a memory device 401 (e.g., a memory device, such as a dual deck 3D NAND Flash memory device).

Referring now to FIG. 4, the microelectronic device 400 may be substantially similar to the microelectronic device 100 following the processing stages previously described with reference to FIG. 3A through FIG. 3E. As shown in FIG. 4, the microelectronic device 400 may include a stack structure 402 that includes a staircase structure 430 defining contact regions for connecting access lines 405 to conductive structures 408. The microelectronic device 400 may include vertical strings 407 of memory cells 418 that are coupled to each other in series. The vertical strings 407 may extend vertically (e.g., in the Z-direction) and orthogonally to the conductive structures 408, such as data lines 403, a source 404, the conductive structures 408, the access lines 405, first select gates 409 (e.g., upper select gates, drain select gates (SGDs)), select lines 411, and a second select gate 413 (e.g., a lower select gate, a source select gate (SGS)). The select gates 409 may be horizontally divided (e.g., in the Y-direction) into multiple block structures 432 and sub-blocks horizontally separated (e.g., in the Y-direction) from one another by slot structures 421.

Vertical conductive contacts 431 may electrically couple components to each other as shown. For example, the select lines 411 may be electrically coupled to the first select gates 409 and the access lines 405 may be electrically coupled to the conductive structures 408. The memory device 401 may also include a control unit 415 positioned under the memory array, which may include control logic devices configured to control various operations of other features (e.g., the strings 407 of memory cells 418) of the memory device 401. By way of non-limiting example, the control unit 415 may include one or more (e.g., each) of charge pumps (e.g., $V_{CCP}$ charge pumps, $V_{NEGWL}$ charge pumps, DVC2 charge pumps), delay-locked loop (DLL) circuitry (e.g., ring oscillators), $V_{dd}$ regulators, drivers (e.g., string drivers), decoders (e.g., local deck decoders, column decoders, row decoders), sense amplifiers (e.g., equalization (EQ) amplifiers, isolation (ISO) amplifiers, NMOS sense amplifiers (NSAs), PMOS sense amplifiers (PSAs)), repair circuitry (e.g., column repair circuitry, row repair circuitry), I/O devices (e.g., local I/O devices), memory test devices, MUX, error checking and correction (ECC) devices, self-refresh/wear leveling devices, and other chip/deck control circuitry. The control unit 415 may be electrically coupled to the data lines 403, the source 404, the access lines 405, the first select gates 409, and the second select gates 413, for example. In some embodiments, the control unit 415 includes CMOS (complementary metal-oxide-semiconductor) circuitry. In such embodiments, the control unit 415 may be characterized as having a "CMOS under Array" ("CuA") configuration.

The first select gates 409 may extend horizontally in a first direction (e.g., the X-direction) and may be coupled to respective first groups of vertical strings 407 of memory cells 418 at a first end (e.g., an upper end) of the vertical strings 407. The second select gate 413 may be formed in a substantially planar configuration and may be coupled to the vertical strings 407 at a second, opposite end (e.g., a lower end) of the vertical strings 407 of memory cells 418.

The data lines 403 (e.g., bit lines) may extend horizontally in a second direction (e.g., in the Y-direction) that is at an angle (e.g., perpendicular) to the first direction in which the first select gates 409 extend. The data lines 403 may be coupled to respective second groups of the vertical strings 407 at the first end (e.g., the upper end) of the vertical strings 407. A first group of vertical strings 407 coupled to a respective first select gate 409 may share a particular vertical string 407 with a second group of vertical strings 407 coupled to a respective data line 403. Thus, a particular vertical string 407 may be selected at an intersection of a particular first select gate 409 and a particular data line 403. Accordingly, the first select gates 409 may be used for selecting memory cells 418 of the strings 407 of memory cells 418.

The conductive structures 408 may extend in respective horizontal planes. The conductive structures 408 may be stacked vertically, such that each conductive structure 408 is coupled to all of the vertical strings 407 of memory cells 418, and the vertical strings 407 of the memory cells 418 extend vertically through the stack of conductive structures 408. The conductive structures 408 may be coupled to or may form control gates of the memory cells 418 to which the conductive structures 408 are coupled. Each conductive structure 408 may be coupled to one memory cell 418 of a particular vertical string 407 of memory cells 418.

The staircase structure 430 may be configured to provide electrical connection between the access lines 405 and the conductive structures 408 through the vertical conductive contacts 431. In other words, a particular level of the conductive structures 408 may be selected via an access line 405 in electrical communication with a respective conductive contact 431 in electrical communication with the particular conductive structure 408.

The data lines 403 may be electrically coupled to the vertical strings 407 through conductive contact structures 420.

Memory devices (e.g., the memory device 401 of FIG. 4) and microelectronic devices (e.g., the microelectronic device 100 of FIGS. 1 and 2) of the disclosure may be included in embodiments of electronic systems of the disclosure. For example, FIG. 5 is a block diagram of an electronic system 503, in accordance with embodiments of the disclosure.

Figure 5:
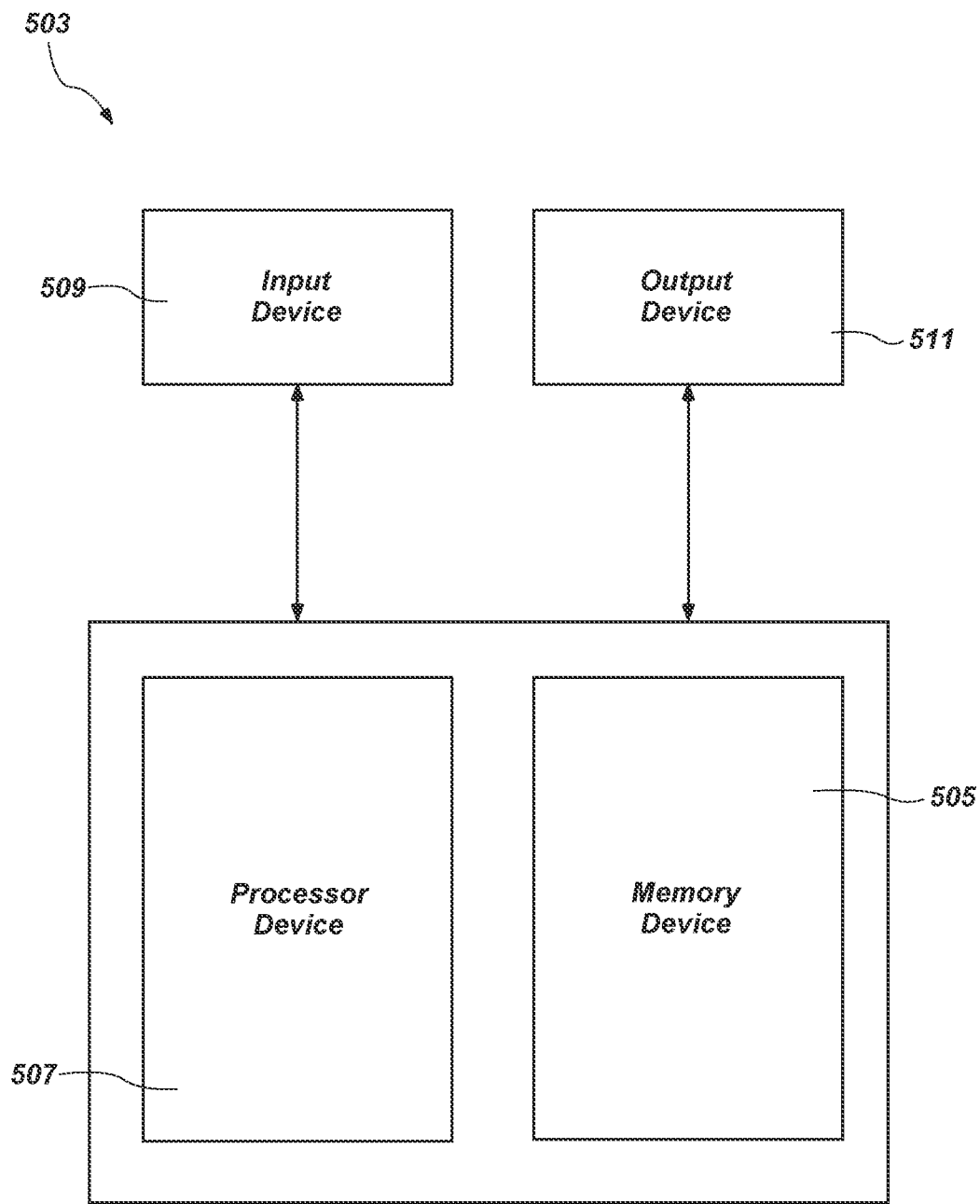
FIG. 5 is a functional block diagram of an electronic system, in accordance with embodiments of the disclosure.

Referring now to FIG. 5, the electronic system 503 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, a navigation device, etc. The electronic system 503 includes at least one memory device 505. The memory device 505 may include, for example, an embodiment of a memory device herein (e.g., the memory device 401 of FIG. 4) and/or a microelectronic device (e.g., the microelectronic device 100, 400) previously described herein.

The electronic system 503 may further include at least one electronic signal processor device 507 (often referred to as a "microprocessor"). The electronic signal processor device 507 may, optionally, include an embodiment of one or more of a memory device and a microelectronic device previously described herein. The electronic system 503 may further include one or more input devices 509 for inputting information into the electronic system 503 by a user, such as, for example, a mouse or other pointing device, a keyboard, a touchpad, a button, or a control panel. While the memory device 505 and the electronic signal processor device 507 are depicted as two (2) separate devices in FIG. 5, in additional embodiments, a single (e.g., only one) memory/processor device having the functionalities of the memory device 505 and the electronic signal processor device 507 is included in the electronic system 500. In such embodiments, the memory/processor device may include one or more of a microelectronic device (e.g., the microelectronic device 100 of FIGS. 1 and 2) and a memory device (e.g., the memory device 401 of FIG. 4) previously described herein. In some embodiments, the memory device 505 of the electronic system 503 comprises strings of memory cells (e.g., the vertical strings 407 of the memory cells 418 of FIG. 4) vertically extending through a stack structure (e.g., the stack structure 102, 402).

The electronic system 503 may further include one or more output devices 511 for outputting information (e.g., visual or audio output) to a user such as, for example, a monitor, a display, a printer, an audio output jack, a speaker, etc. In some embodiments, the input device 509 and the output device 511 may comprise a single touchscreen device that can be used both to input information to the electronic system 503 and to output visual information to a user. The input device 509 and the output device 511 may communicate electrically with one or more of the memory device 505 and the electronic signal processor device 507.

Thus, in accordance with embodiments of the disclosure, an electronic system comprises an input device, an output device, a processor, and a memory device. The processor is operably coupled to the input device and the output device. The memory device is operably coupled to the processor device and comprises a microelectronic device. The microelectronic device comprises a stack structure, a contact structure, a liner material, and a boron-containing material. The stack structure comprises vertically alternating conductive structures and dielectric structures. Side surfaces of the conductive structures are vertically recessed relative to side surfaces of the dielectric structures. The contact structure extends through the stack structure. The liner material surrounds the contact structure. The boron-containing material is between the liner material and the stack structure. Portions of the boron-containing material horizontally adjacent the conductive structures are offset from additional portions of the boron-containing material horizontally adjacent the dielectric structures.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

The methods of the disclosure may facilitate the formation of microelectronic devices (e.g., memory devices) and systems (e.g., electronic systems) having one or more of increased performance, increased efficiency, increased reliability, and increased durability as compared to conventional devices (e.g., conventional memory devices) and conventional systems (e.g., conventional electronic systems).

While the disclosure is susceptible to various modifications and alternative forms, specific embodiments have been shown by way of example in the drawings and have been described in detail herein. However, the disclosure is not intended to be limited to the particular forms disclosed. Rather, the disclosure is to cover all modifications, equivalents, and alternatives falling within the scope of the disclosure as defined by the following appended claims and their legal equivalents. For example, elements and features disclosed in relation to one embodiment of the disclosure may be combined with elements and features disclosed in relation to other embodiments of the disclosure.

What is claimed is:

1. A microelectronic device, comprising:
    a stack structure comprising vertically alternating conductive structures and dielectric structures;
    a contact structure vertically extending through the stack structure;
    a liner material between the stack structure and the contact structure; and a boron-containing material between the liner material and the stack structure.

2. The microelectronic device of claim 1, wherein the boron-containing material is on side surfaces of the stack structure.

3. The microelectronic device of claim 1, wherein the boron-containing material directly contacts side surfaces of the stack structure.

4. The microelectronic device of claim 3, wherein the liner material comprises a dielectric material and is separated from a source by the boron-containing material.

5. The microelectronic device of claim 1, wherein the liner material comprises a conformal oxide.

6. The microelectronic device of claim 1, wherein the boron-containing material comprises elemental boron, polymeric boron, a boron oxide material, a silicon boride material, a silicon boron oxide material, or a combination thereof.

7. The microelectronic device of claim 1, wherein the liner material contacts the boron-containing material and the contact structure.

8. The microelectronic device of claim 1, wherein a thickness of the boron-containing material ranges from about 1 nm to about 50 nm.

9. The microelectronic device of claim 1, wherein a chemical composition of the boron-containing material is substantially homogeneous.

10. The microelectronic device of claim 1, wherein a chemical composition of the boron-containing material is heterogeneous.

11. The microelectronic device of claim 1, wherein the liner material horizontally neighbors the stack structure and the contact structure.

12. The microelectronic device of claim 1, wherein a portion of the liner material between the dielectric structures and the contact structure exhibits a smaller thickness than portions of the liner material horizontally neighboring the conductive structures of the stack structure and the contact structure.

13. A microelectronic device, comprising:
a stack structure comprising a contact structure and tiers of alternating conductive structures and dielectric structures;
a boron-containing material on vertical surfaces of the tiers; and
a dielectric material between the boron-containing material and the contact structure.

14. The microelectronic device of claim 13, wherein conductive structures of the tiers are horizontally recessed relative to the dielectric structures, and wherein a portion of a liner material and of the boron-containing material are within recesses horizontally adjacent to the conductive structures.

15. The microelectronic device of claim 13, wherein the boron-containing material is on horizontal surfaces of the dielectric structures.

16. The microelectronic device of claim 13, wherein the boron-containing material separates the dielectric material from the stack structure.

17. The microelectronic device of claim 13, wherein the boron-containing material comprises boron oxide.

18. The microelectronic device of claim 13, wherein the contact structure is horizontally adjacent to the tiers of alternating conductive structures and dielectric structures.

19. An electronic system, comprising:
an input device;
an output device;
a processor device operably coupled to the input device and the output device; and
a memory device operably coupled to the processor device, the memory device comprising a microelectronic device, comprising:
a stack structure comprising vertically alternating conductive structures and dielectric structures, side surfaces of the conductive structures being vertically recessed relative to side surfaces of the dielectric structures;
a contact structure extending through the stack structure;
a liner material surrounding the contact structure; and
a boron-containing material between the liner material and the stack structure, portions of the boron-containing material horizontally adjacent the conductive structures being offset from additional portions of the boron-containing material horizontally adjacent the dielectric structures.

20. The electronic system of claim 19, wherein a portion of the liner material is between vertically adjacent conductive structures.

* * * * *